(12) United States Patent
Bae et al.

(10) Patent No.: US 9,614,504 B2
(45) Date of Patent: Apr. 4, 2017

(54) ELECTRONIC DEVICE AND CLOCK CONTROL METHOD THEREOF

(71) Applicant: SAMSUNG ELECTRONICS CO., LTD., Suwon-si (KR)

(72) Inventors: Gun-young Bae, Yongin-si (KR); Dong-bin Park, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 14/742,227

(22) Filed: Jun. 17, 2015

(65) Prior Publication Data

US 2016/0036421 A1    Feb. 4, 2016

(30) Foreign Application Priority Data

Jul. 29, 2014   (KR) .................. 10-2014-0096296

(51) Int. Cl.
| | | |
|---|---|---|
| G06F 1/04 | (2006.01) | |
| H03K 5/00 | (2006.01) | |
| H03L 7/08 | (2006.01) | |
| H04B 10/116 | (2013.01) | |
| H04L 7/00 | (2006.01) | |
| G01J 1/02 | (2006.01) | |
| H03K 7/08 | (2006.01) | |

(52) U.S. Cl.
CPC ............ *H03K 5/00006* (2013.01); *G01J 1/02* (2013.01); *H03K 7/08* (2013.01); *H03L 7/08* (2013.01); *H04B 10/116* (2013.01); *H04L 7/0012* (2013.01); *H03L 2207/50* (2013.01)

(58) Field of Classification Search
CPC ......... H03K 5/00006; H03K 7/08; G01J 1/02; H04L 7/0012; H04B 10/116; H03L 7/08; H03L 2207/50
USPC .................................................. 327/156, 159
See application file for complete search history.

(56) References Cited

U.S. PATENT DOCUMENTS

| | | | |
|---|---|---|---|
| 7,483,448 B2 | 1/2009 | Bhandari et al. | |
| 7,948,285 B2* | 5/2011 | Tsuda | H03L 7/085 327/147 |
| 7,952,412 B2* | 5/2011 | Bergman | G06F 1/08 327/291 |
| 7,994,867 B2* | 8/2011 | Kobayashi | H03L 7/08 327/156 |

(Continued)

FOREIGN PATENT DOCUMENTS

| | | |
|---|---|---|
| EP | 0187310 B1 | 7/1992 |
| EP | 1613090 A2 | 1/2006 |

(Continued)

OTHER PUBLICATIONS

Communication dated Dec. 8, 2015, issued by the European Patent Office in counterpart European Application No. 15174250.9.

*Primary Examiner* — Kenneth B Wells
(74) *Attorney, Agent, or Firm* — Sughrue Mion, PLLC

(57) ABSTRACT

A user terminal device and a display method thereof are provided. A method for controlling a clock according to an exemplary embodiment includes generating a clock, generating a comparison clock corresponding to a frequency of an external alternating current (AC) power source, counting a number of clock cycles according to the comparison clock, and controlling a generation period of the clock according to the counted number of clock cycles.

18 Claims, 9 Drawing Sheets

(56) References Cited

U.S. PATENT DOCUMENTS

| | | | |
|---|---|---|---|
| 8,860,478 B2 * | 10/2014 | Chen | H03L 7/08 |
| | | | 327/156 |
| 8,933,737 B1 * | 1/2015 | Chatterjee | H03L 7/095 |
| | | | 327/149 |
| 2013/0194497 A1 | 8/2013 | Kim et al. | |
| 2013/0338805 A1 | 12/2013 | Cheng | |

FOREIGN PATENT DOCUMENTS

| | | |
|---|---|---|
| EP | 1633060 A1 | 3/2006 |
| JP | 52-68468 | 6/1977 |
| JP | 2005-260966 A | 9/2005 |
| KR | 10-2005-0000175 A | 1/2005 |
| KR | 10-2005-0120490 A | 12/2005 |
| KR | 10-2013-0088684 A | 8/2013 |
| WO | 02/073850 A2 | 9/2002 |

\* cited by examiner

ELECTRONIC DEVICE AND CLOCK CONTROL METHOD THEREOF

CROSS-REFERENCE TO RELATED APPLICATION

This application claims priority from Korean Patent Application No. 10-2014-0096296, filed on Jul. 29, 2014, in the Korean Intellectual Property Office, the disclosure of which is incorporated herein by reference in its entirety.

BACKGROUND

1. Field

Methods and apparatuses consistent with exemplary embodiments relate to an electronic device and a method for controlling a clock thereof, and more particularly, to an electronic device capable of synchronizing another electronic device with a clock signal if a plurality of electronic devices are used, and a method for controlling a clock thereof.

2. Description of Related Art

When a large video wall is realized using a plurality of display devices, or video and audio are output from a separate electronic device, it is required to synchronize a clock signal between a plurality of electronic devices.

To synchronize data output from each of a plurality of electronic devices, technology is required to synchronize a clock signal.

Conventionally, a plurality of devices uses a separate clock synchronization device to synchronize a clock signal, or synchronize a clock signal through a wired connection between a plurality of devices.

According to the conventional method, many shared lines were used, and thus a signal transmitted through the lines was delayed.

Accordingly, if multimedia data is output from a plurality of electronic devices, respectively, even though a separate shared line or a separate synchronization device is not used, technology is required for synchronizing a clock.

SUMMARY

Aspects of the exemplary embodiments provide an electronic device capable of synchronizing another electronic device with a clock signal while a user uses a plurality of electronic devices, and a method for controlling a clock thereof.

According to an aspect of an exemplary embodiment, there is provided a method for controlling a clock of an electronic device includes generating a clock signal of the electronic device; generating a comparison clock signal having a frequency corresponding to a frequency of an alternating current (AC) power source; counting a number of clock cycles of the clock signal in a period of the comparison clock; and controlling a frequency of the clock according based on the counted number of clock cycles.

The frequency of the AC power may be determined by monitoring a light fluctuation frequency.

The controlling may include, in response to the number of the clock cycles counted during the period of the comparison clock being less than a threshold value, increasing the frequency of the clock signal, and in response to the number of the generated clock cycles being more than the threshold value, decreasing the frequency of the clock signal.

The controlling may include controlling a voltage input to a clock generator for generating the clock.

The controlling may include, in response to a number of cycles generated during the period of the comparison clock being less than a threshold value, increasing the frequency of the clock signal by increasing a voltage input to a clock generator, and in response to the number of generated clock cycles being more than the threshold value, decreasing the frequency of the clock signal by decreasing the voltage input to the clock generator.

The controlling may include generating a PWM signal for generating the clock.

The generating the PWM signal may include, in response to the number of clock cycles generated during the period of the comparison clock being less than a threshold value, controlling a pulse width of the PWM signal to become wider, and in response to the number of the generated clock cycles being more than the threshold value, controlling the pulse width of the PWM signal to become narrower.

The method may further include determining a reference time from which the number of clock cycles is counted using a network time protocol (NTP).

According to an aspect of another exemplary embodiment, there is provided an electronic device, includes: a clock generator configured to generate a comparison clock signal having a frequency corresponding to a frequency of an external AC power source and a clock signal of the electronic device; a counter configured to count a number of clock cycles of the clock signal in a period of the comparison clock; and a clock period controller configured to control a generation period of the clock according to the counted number of clock cycles.

The electronic device may further include a photodetector configured to detect a light fluctuation frequency. The frequency of the external AC power may be determined based on the light fluctuation frequency of light emitted by a light source.

The clock period controller may be configured to, in response to the number of the clock cycles counted during the period of the comparison clock being less than a threshold value, control the generation period of the clock to become shorter, and in response to the number of the clock cycles counted being more than the threshold value, control the generation period of the clock to become longer.

The clock period controller may be configured to control the generation period of the clock by controlling a voltage input to a clock generator configured to generate the clock.

The clock period controller may be configured to, in response to the number of clock cycles generated during the period of the comparison clock being less than a threshold value, control a generation period of the clock to become shorter by increasing a voltage input to the clock generator, and in response to the number of generated clock cycles being more than the threshold value, control the generation period of the clock to become longer by decreasing the voltage input to the clock generator.

The electronic device may further include: a PWM signal controller configured to generate a PWM signal for generating the clock signal.

The PWM signal controller may be configured to, in response to the number of clock cycles generated during the period of the comparison clock being less than a threshold value, control a pulse width of the PWM signal to become wider, and in response to the number of the generated clock cycles being more than the threshold value, control the pulse width of the PWM signal to become narrower.

The electronic device may further include: a determiner configured to determine a reference time from which the number of clock cycles is counted using a network time protocol (NTP).

According to an aspect of another exemplary embodiment, an electronic device includes: a clock signal generator comprising: a clock generator configured to generate a clock signal; and a comparison clock generator configured to generate a comparison clock signal; a photodetector configured to detect light; and a controller configured to identify a periodic fluctuation in the detected light and control the clock signal generator to synchronize the comparison clock signal with the periodic fluctuation and based on the comparison clock signal, synchronize the clock signal with an external clock signal of an external device.

The controller may be configured to control the clock generator to generate the clock signal at a frequency corresponding to a predetermined number of clock cycles per comparison cycle of the comparison clock signal.

DETAILED DESCRIPTION OF EXEMPLARY EMBODIMENTS

Figure 1:
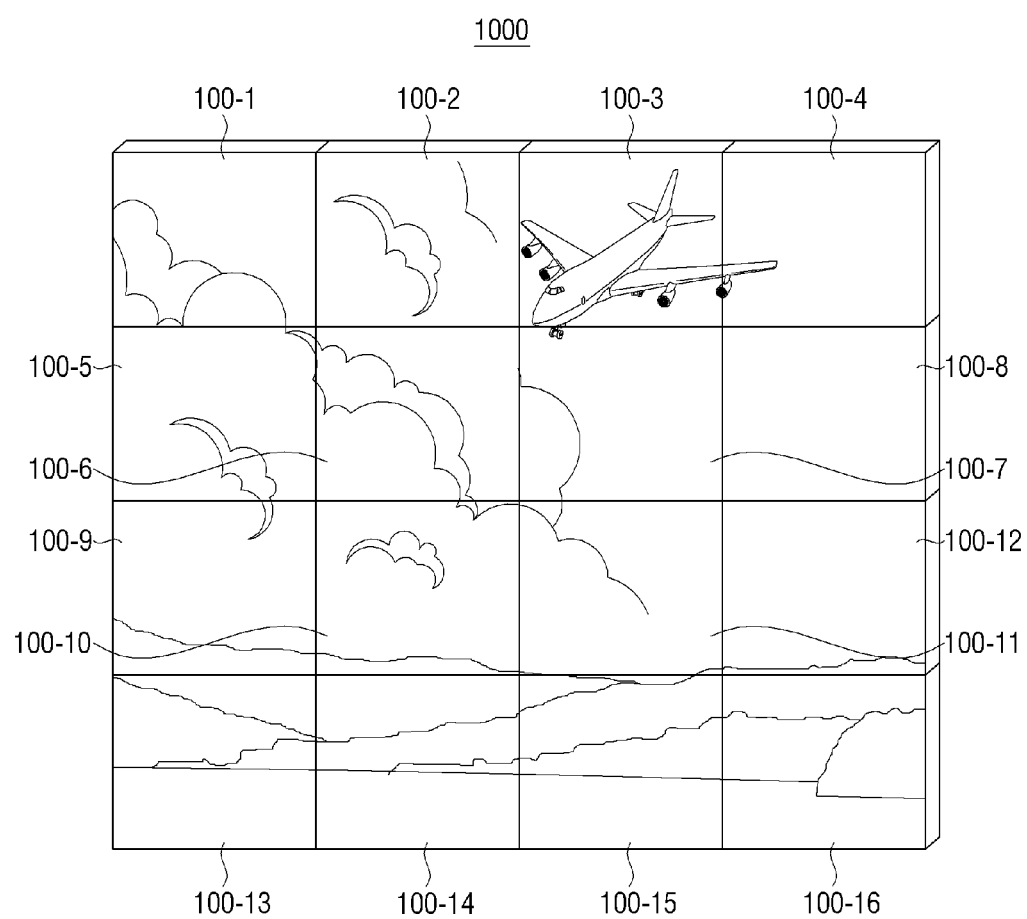
FIG. 1. is a view illustrating a plurality of display devices realizing a large display according to an exemplary embodiment.

In the following description, the same drawing reference numerals are used for same or similar elements, even in different drawings. The matters defined in the description, such as detailed construction and elements, are provided to assist in a comprehensive understanding of the exemplary embodiments. Thus, it is apparent that the exemplary embodiments can be carried out without those specifically defined matters. Also, well-known functions or constructions are not described in detail since they would obscure the exemplary embodiments with unnecessary detail. Expressions such as "at least one of," when preceding a list of elements, modify the entire list of elements and do not modify the individual elements of the list.

FIG. 1 is a view illustrating a large display system 1000 according to an exemplary embodiment. Specifically, the large display system 1000 illustrated in FIG. 1 is realized by a plurality of displays 100-1 to 100-16 which separately display an image.

As illustrated in FIG. 1, if an image is displayed through a plurality of displays 100-1 to 100-16, it is necessary for each of the displays to share a vertical synchronization (V-sync) signal and a frequency (for example, 27 MHz) of a clock signal for generating a vertical synchronization (V-sync) signal.

If a plurality of displays 100-1 to 100-16 have unsynchronized clock signals, the playback timing for an image output from each of the displays will not coincide. Accordingly, it is necessary to synchronize a clock signal in each of the displays to acquire a visual effect that a single image is played on the large display system 1000.

Figure 2:
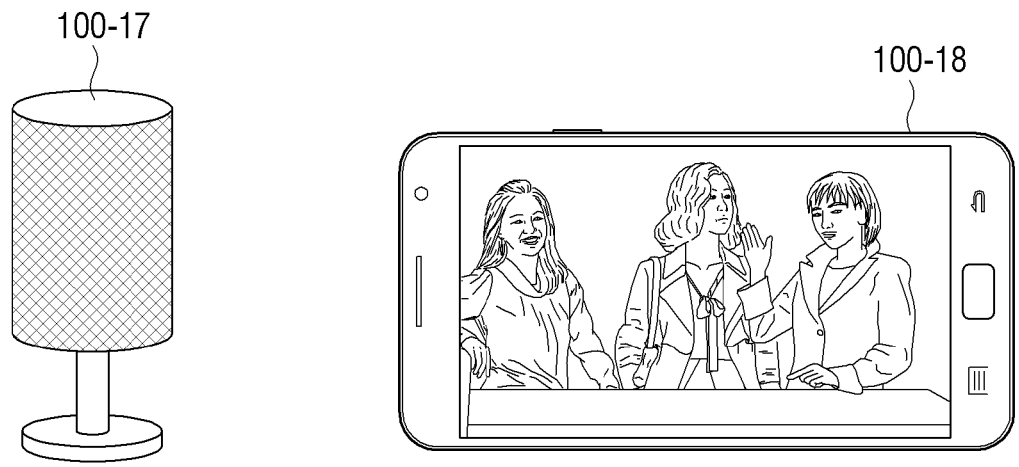
FIG. 2 is a view illustrating a plurality of electronic devices outputting a video and audio signal according to an exemplary embodiment.

FIG. 2 is a view illustrating another exemplary embodiment in which a synchronization of a clock signal is necessary. According to an exemplary embodiment, FIG. 2 is a view illustrating a video and audio play system 2000.

The video and audio play system 2000 illustrated in FIG. 2 may display an image through a display device, such as a smartphone 100-18, and output audio data corresponding to the displayed image using a separate speaker 100-17.

Audio corresponding to a video frame output through the smartphone 100-18 should be output through the separate speaker 100-17, and thus, the video and audio play system 2000 needs to synchronize a clock signal.

If synchronization of a clock signal for synchronizing an output of video and audio of the smartphone 100-18 and the speaker 100-17 is not performed, a user may be inconvenienced, as it seems that an image played in the smartphone 100-18 does not correspond to a sound output from the speaker 100-17.

Figure 3:
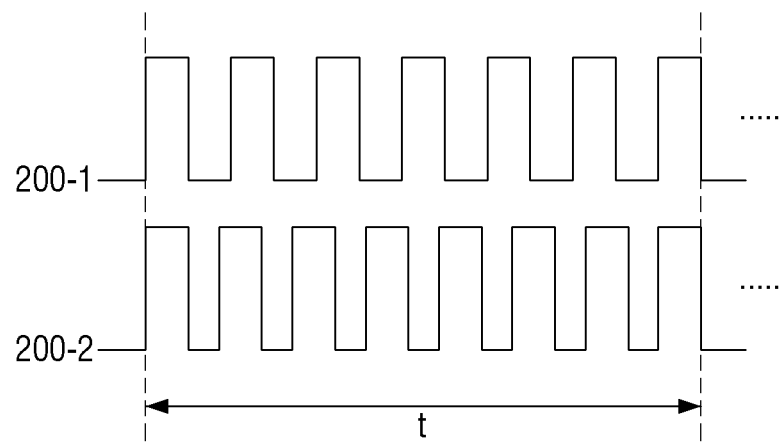
FIG. 3 is a view illustrating a plurality of clock signals according to an exemplary embodiment.

FIG. 3 illustrates clock signals when a synchronization between the first clock signal 200-1 of the first electronic device and the second clock signal 200-2 of the second electronic device is not performed according to an exemplary embodiment.

Even if the first clock signal 200-1 is only slightly different from the second clock signal 200-2, the synchronization may vary as time passes. Accordingly, as illustrated in FIG. 3, after time period t passes, the first clock signal 200-1 and the second clock signal 200-2 are no longer synchronized.

For example, if a single video frame is output according to a single pulse, during time period t the first electronic device may output seven video frames according to the first clock signal 200-1, and the second electronic device may output eight video frames according to the second clock signal 200-2.

After time period t passes, the first electronic device outputs the eighth video frame, and the second electronic device outputs the ninth video frame.

Accordingly, if a clock signal is output, as illustrated in FIG. 3, timing of an image output from each of the displays in the large display system 1000 illustrated in FIG. 1 does not match up. Also, in the video and audio play system 2000 of FIG. 2, a video output from the smartphone 100-18 and an audio output from the separate speaker 100-17 do not match up with each other, so that a user feels uncomfortable using audio-visual data.

Figure 4:
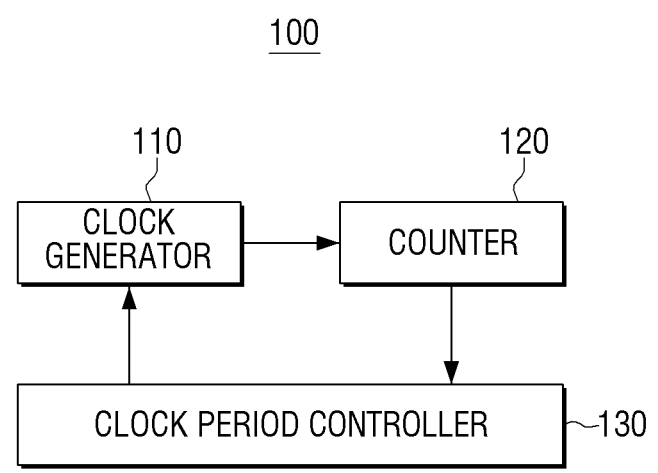
FIG. 4 is a block diagram illustrating a configuration of an electronic device according to an exemplary embodiment.

FIG. 4 is a block diagram illustrating a configuration of the electronic device, according to an exemplary embodiment.

As illustrated in FIG. 4, the electronic device 100 includes a clock generator 110, a counter 120 and a clock period controller 130. The electronic device 100 may be realized as a display device as illustrated in FIG. 1, or a smartphone or a speaker as illustrated in FIG. 2, but these are merely exemplary embodiments. The electronic device 100 may be realized as any one of various devices, such as a television (TV) including a function of outputting audio or video data, a cell phone, a tablet personal computer (PC), a digital camera, a camcorder, a notebook PC, a personal digital assistant (PDA), a home theater, an audio, a broadcast transmission device and the like.

The clock generator 110 is an element for generating a clock of the electronic device 100. That is, the clock generator 110 may generate a clock having a predetermined frequency such as 27 MHz.

According to an exemplary embodiment, the clock generator 110 may be realized as an oscillator. That is, if a voltage or a current is supplied to an oscillator, the oscillator may output a voltage in a shape of a wave, such as a sine wave. Such an output voltage then passes through a filter, and a pulse is generated.

The clock generator 110 may generate a comparison clock using an external AC (alternating current) power. The external AC power has a predetermined frequency, for example 60 Hz or 50 Hz. Generally, the electronic device 100 is connected to an external AC power source. Accordingly, the clock generator 110 may generate a comparison clock having a period identical to a frequency of the AC power source connected to the electronic device 100.

The clock generator 110 may sense light output through another device connected an external AC power source and generate a comparison clock according to a periodicity of the sensed light. That is, if the electronic device 100 is not connected to an external AC power source, the clock generator 110 may generate a comparison clock by sensing fluctuations of a lighting device, such as a fluorescent lamp, connected to the external AC power source by use of a photodetector, or the like.

The counter 120 is an element for counting clock cycles according to a comparison clock generated by the clock generator 110. That is, the counter 120 may count the number of cycles generated during a period of the comparison clock.

The clock period controller 130 is an element for controlling a generation period of a clock signal used to synchronize an external electronic device in accordance with an output of the counter 120.

According to an exemplary embodiment, if the counted number of clock cycles generated during a period of a comparison clock is less than a threshold value, the clock period controller 130 may control a frequency of the clock to increase. Also, if the number of clock cycles generated during a period of a comparison clock is more than a threshold value as a result of counting, the clock period controller 130 may control a frequency of the clock to decrease.

The clock period controller 130 may control power of a clock generator for generating a clock, and then control a generation period of the clock. That is, according to an output of the counter 120, the clock period controller 130 may control power supplied to the clock generator 110, and then control a generation period of the clock.

According to an exemplary embodiment, if the counted number of clock cycles generated during a period of a comparison clock is less than a threshold value, the clock period controller 130 may increase a voltage of a clock generator so that a frequency of the clock increases. Also, if the number of generated clock cycles is more than a threshold value, the clock control period controller 130 may decrease a voltage of a clock generator so that a frequency of the clock decreases.

Hereinafter, a method of counting clock cycles according to an exemplary embodiment will be explained in detail with reference to FIGS. 5 and 6.

Figure 5:
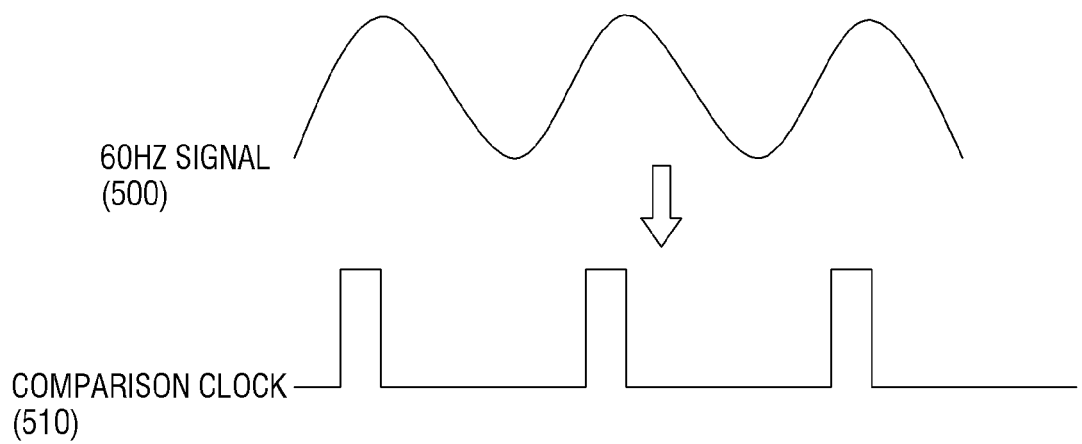
FIG. 5 is a view illustrating a comparison clock generated through an external alternating current (AC) power according to an exemplary embodiment.

As illustrated in FIG. 5, a frequency of an external AC power is, for example, 60 Hz. A frequency of AC power may vary from region to region, but an identical frequency is used in which a plurality of electronic devices are synchronized with each other are used.

The clock generator 110 may generate a comparison clock 510, which is a pulse signal having a frequency identical to an alternating current 500 supplied from an external AC power source. For example, the frequency may be 60 Hz.

If the electronic device 100 is not connected to an external AC power source, the clock generator 110 may sense a periodic pulse of light output by a light source connected to the external AC power, and generate the comparison clock 510 according to a periodicity of the sensed light. That is, a fluorescent lamp uses AC power, and thus, the clock generator 110 may generate the comparison clock 510 of a frequency identical to a frequency of the AC power using light emitted from a lighting device, such as a fluorescent lamp.

Figure 6:
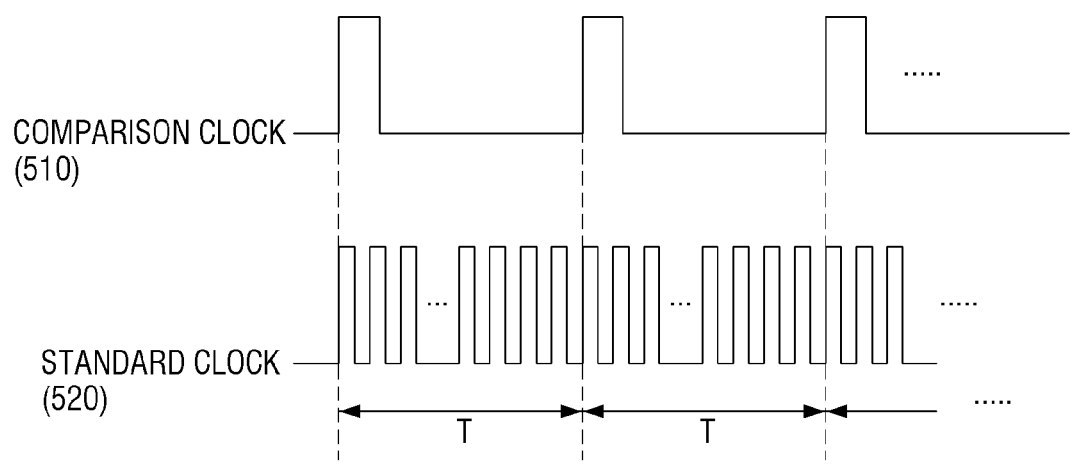
FIG. 6 is a view illustrating a comparison clock for counting clock cycles and a clock according to an exemplary embodiment.

FIG. 6 is a view illustrating a method for counting the number of clock cycles 520, according to an exemplary embodiment. The counter 120 may count the number of the clock cycles 520 generated during a period of the comparison clock 510. More specifically, the counter 120 may count the number of clock cycles generated during time period T in which the comparison clock 510 is generated. Also, the electronic device 100 may control a generation period of a clock according to an output of the counter 120.

Hereinafter, referring to FIG. 7, a configuration for controlling a generation period of a clock according to an exemplary embodiment will be explained.

Figure 7:
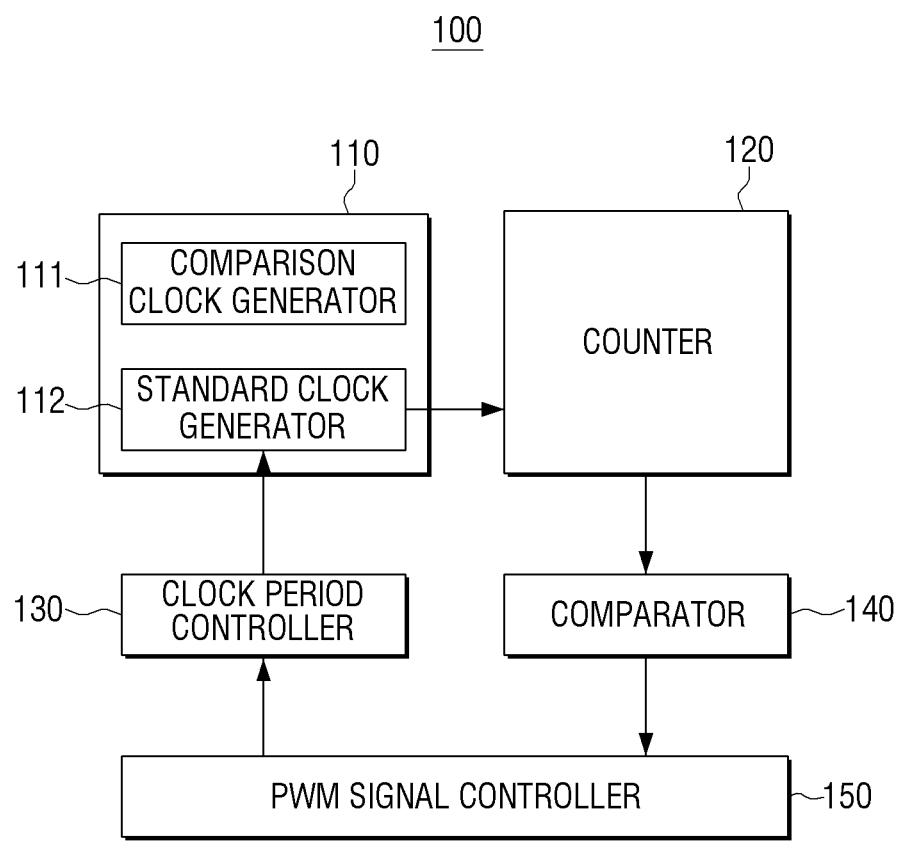
FIG. 7 is a block diagram illustrating a configuration of an electronic device according to an exemplary embodiment.

As illustrated in FIG. 7, the electronic device 100 may further include a comparator 140 and a pulse width modulation (PWM) signal controller 150 in addition to the clock generator 110, the counter 120, and the clock period controller 130.

The clock generator 110 may include a comparison clock generator 111 and a clock generator 112. The comparison clock generator 111 may generate a comparison clock using an external AC power source. The external AC power source has a predetermined frequency of 60 Hz, for example.

If the electronic device 100 uses an external AC power source, then the comparison clock generator 111 may generate a comparison clock having a period identical to a period of an AC power source using the AC power connected to the electronic device 100.

The clock generator 112 may generate a clock having a predetermined frequency. According to an exemplary embodiment, the clock generator 112 may be realized as an oscillator. That is, if a voltage or a current is supplied to an oscillator, the oscillator may output a voltage in a shape of a wave, such as a sine wave. Such an output voltage then passes through a filter, and a pulse is generated.

The counter 120 is an element for counting clock cycles according to a comparison clock. That is, the counter 120 may count the number of clock cycles generated during a period of the comparison clock. For example, the counter 120 may count the number of clock cycles generated during time period T in which a comparison clock is generated.

The comparator 140 is an element for comparing an output of the counter 120 with a threshold value. For example, if the threshold value of a clock generated during time period T in which a comparison clock is generated is 10, the comparator 140 determines whether the number of clock cycles counted during time period T is 10.

The PWM signal controller 150 is an element for generating a PWM signal to control a generation period of a clock cycle. The PWM signal controller 150 adjusts the generation period of the clock cycle if the number of clock cycles counted is not identical to the threshold value, according to a result of the comparison.

According to an exemplary embodiment, if the number of clock cycles during a period of a comparison clock is less than a threshold value, the PWM signal controller 150 may increase the pulse width of the PWM signal. Also, if the number of generated clock cycles is more than a threshold value, the PWM signal controller 150 may decrease the pulse width of the PWM signal.

In other words, the electronic device 100 may control a voltage input to a clock generator and thereby control a period of a clock cycle according to an output of the counter 120. Meanwhile, the electronic device 100 may easily control a voltage input to a clock generator 110 by controlling the pulse width of a PWM signal.

According to an exemplary embodiment, if the pulse width of a PWM signal becomes too wide, a voltage input to the clock generator is increased. Accordingly, a frequency of a clock increases. However, if the pulse width of a PWM signal becomes too narrow, a voltage input to the clock generator is decreased. Accordingly, a frequency of the clock is reduced. Accordingly, the electronic device 100 may control a generation period of a clock by controlling the pulse width of a PWM signal.

If the number of clock cycles generated during time period T in which a comparison clock is generated corresponds to a predetermined threshold value, the clock period controller 130 of the electronic device 100 is able to maintain a clock period.

The electronic device 100 may determine a first point for counting clock cycles during a period of a comparison clock using a network time protocol (NTP).

Network time protocol is a protocol for synchronizing the time of an electronic device with a clock through the Internet. Accordingly, if each of a plurality of electronic devices for synchronizing a clock use Internet communication, the first point for outputting a video signal, an audio signal, or the like, according to the counting of a clock, may be determined using NTP.

However, NTP is exemplary, and a method for determining the first point is not limited thereto. For example, the first point may be determined by various methods, such as determining the first point by considering a network delay between a plurality of electronic devices, and the like.

By implementing the electronic device 100 described above, the large display system 1000 including a plurality of displays 100-1 to 100-16, as described in FIG. 1, may output image data as if the image is displayed by a single display. The video and audio system 2000 as illustrated in FIG. 2 may synchronously output audio corresponding to video output from the smartphone 100-18 through a separate speaker 100-17.

The electronic device 100 may control a generation period of a clock by counting clock cycles according to a comparison clock, and this method may be performed or not performed (on/off) in accordance with a user selection.

A user may turn on a function of generating a comparison clock through an external AC power source and counting clock cycles according to the generated comparison clock through a separate setting menu or a UI menu displayed in each of a plurality of electronic devices or an arbitrary electronic device. Also, a user may turn off a function of controlling a generation period of a clock by counting clock cycles according to a comparison clock.

Figure 8:
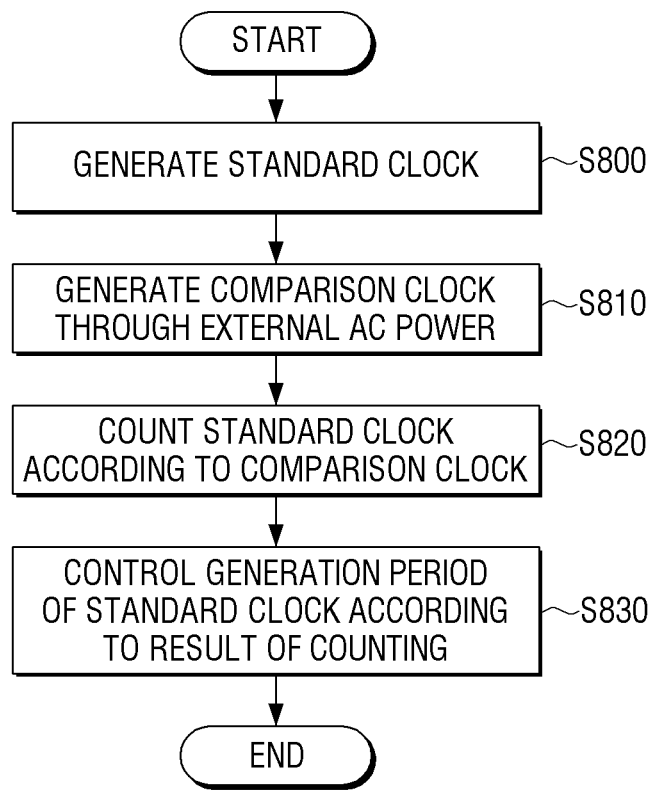
FIG. 8 is a flowchart illustrating a method for controlling a clock of an electronic device according to an exemplary embodiment.

FIG. 8 is a flowchart illustrating a method of controlling a clock of the electronic device 100 according to an exemplary embodiment. First, the electronic device 100 generates a clock (S800). The electronic device 100 may be realized as an oscillator. That is, if a voltage or a current is supplied to an oscillator, the oscillator may output a voltage in the shape of a wave, such as a sine wave. Such an output voltage passes through a filter and a pulse is then generated.

Then, the electronic device 100 generates a comparison clock based on an external AC power source (S810). The external AC power has a predetermined frequency of, for example, 50 Hz or 60 Hz. Generally, the electronic device 100 uses an external AC power source. Accordingly, the electronic device 100 may generate a comparison clock having a period identical to a period of an AC power using the AC power connected to the electronic device 100.

If the electronic device 100 is not connected to an external AC power, the electronic device 100 may sense light fluctuations of light sources connected to the external AC power by use of a photodetector, or the like, and generate a comparison clock according to a periodicity of the sensed light. That is, a fluorescent lamp uses external AC power, and thus, the electronic device 100 may generate a comparison clock of a frequency identical to a frequency of the AC power by monitoring fluctuations of a lighting lamp, such as a fluorescent lamp, by use of a photodetector, or the like.

The electronic device 100 counts clock cycles according to a comparison clock (S820). According to an exemplary embodiment, the electronic device 100 may count the number of clock cycles during time period T of a comparison clock. That is, the number of clock cycles generated during time period T is predetermined. Accordingly, the electronic device 100 may determine whether the number of clock cycles during time period T is identical to a threshold value.

The electronic device 100 controls a generation period of a clock according to a result of counting (S830). Specifically, the electronic device 100 may control a voltage supplied to a clock generator according to a result of counting and control a generation period of the clock.

According to an exemplary embodiment, if the counted number of clock cycles generated during a period of a comparison clock is less than a threshold value, the electronic device 100 may increase a voltage input to a clock generator so that a frequency of the clock increases. Also, if the number of counted cycles is more than a threshold value, the electronic device 100 may decrease a voltage input to the clock generator so that a generation period of the clock decreases.

The electronic device 100 may control a generation period of a clock to become slower or faster, so that a predetermined number of clock cycles is generated during T period of the comparison clock.

Figure 9:
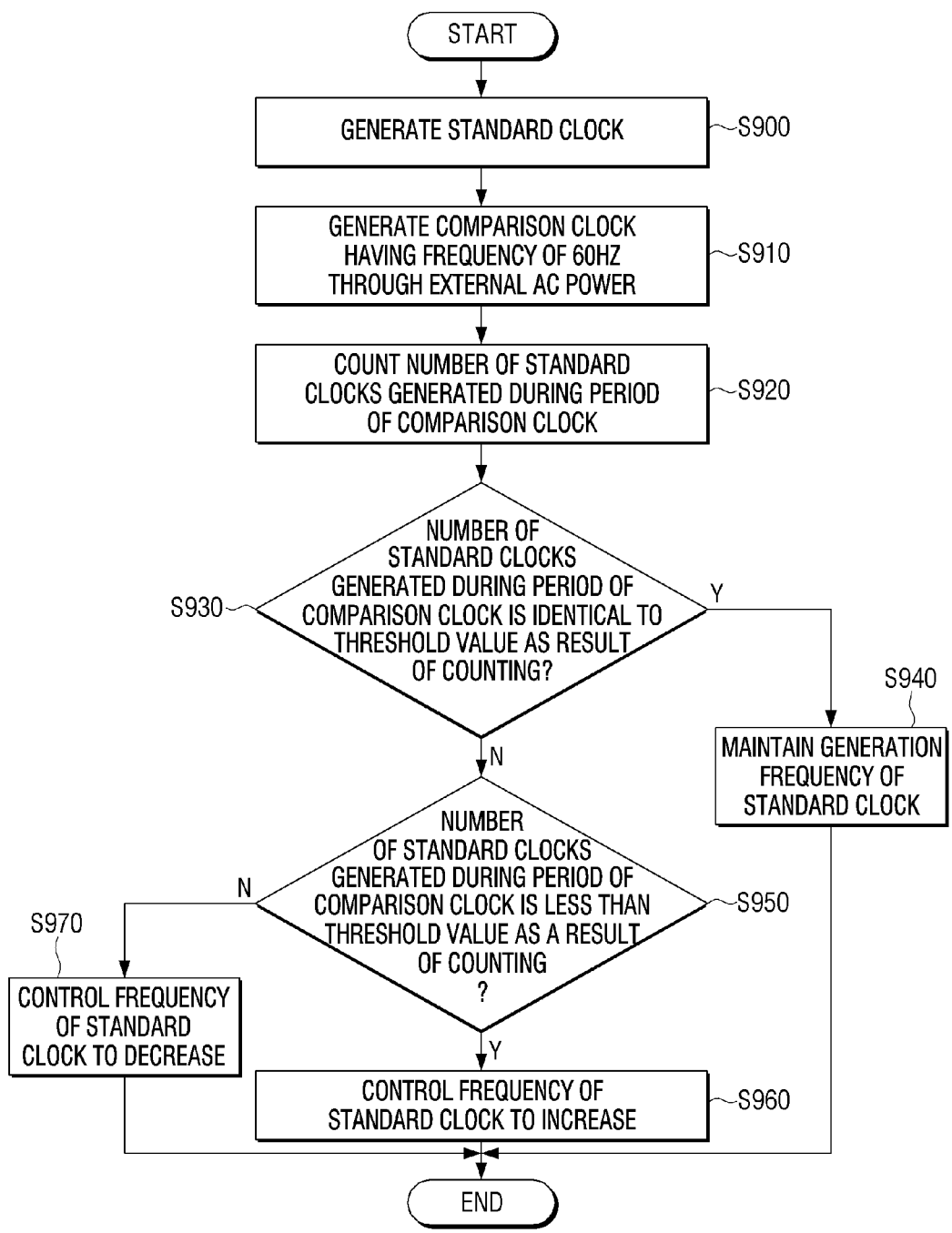
FIG. 9 is a flowchart illustrating a method for controlling a clock of an electronic device according to an exemplary embodiment.

FIG. 9 is a flowchart illustrating a method for controlling a clock of an electronic device in detail according to an exemplary embodiment. First of all, the electronic device 100 generates a clock (S900). According to an exemplary embodiment, the electronic device 100 may be an oscillator. That is, if a voltage or a current is supplied to an oscillator, the oscillator may output a voltage in a shape of a wave, such as a sine wave. If such an output voltage passes through a filter, a pulse is generated.

The electronic device 100 generates a comparison clock having a frequency of 60 Hz through an external AC power (S910). The external AC power has a predetermined frequency. Specifically, an external AC power source in many regions has a frequency of 60 Hz. The electronic device 100 generally uses the external AC power source, and thus the electronic device 100 may generate a comparison clock having a frequency identical to a frequency of an AC power, which is 60 Hz, using the AC power connected to the electronic device 100.

If the electronic device 100 is not connected to an external AC power source, the electronic device 100 may sense light fluctuations in light output from a device connected to the external AC power source, by use of a photodetector, or the like, and generate a comparison clock according to a periodicity of the sensed light. That is, a fluorescent lamp uses a power of an external AC, and thus, the electronic device 100 may generate a comparison clock having a frequency identical to a frequency of the AC power, which is 60 Hz, using a lighting device, such as a fluorescent lamp.

The electronic device 100 counts the number of clock cycles generated during a period of a comparison clock (S920). According to an exemplary embodiment, the electronic device 100 may count the number of clock cycles generated during time period T of a comparison clock. That is, a frequency of an external AC power is 60 Hz, and thus the electronic device 100 may count the number of clock cycles generated during 1/60 of a second.

The number of clock cycles which should be generated during 1/60 of a second is predetermined. Accordingly, the electronic device 100 may determine whether the number of clock cycles generated during 1/60 of a second is identical to a threshold value.

For example, if 10 clock cycles are set to be generated during 1/60 of a second, the electronic device 100 may count the number of clock cycles generated during 1/60 of a second and determine whether the counted number of clock cycles is 10.

The electronic device 100 determines whether the number of clock cycles generated during a period of a comparison clock is identical to a threshold value as a result of counting (S930). That is, as described above, the electronic device 100 may determine whether the counted number of clock cycles is 10.

As a result of the determination, if the number of clock cycles during a period of a comparison clock is identical to a threshold value (S930-Y), the electronic device 100 maintains a generation frequency of the clock (S940). That is, if the number of clock cycles generated during a period of a comparison clock is identical to a threshold value, it represents that an output signal of the electronic device 100 is synchronized with an output signal of another external electronic device. Accordingly, the electronic device 100 may maintain a generation frequency of a clock, and after the threshold time, count the number of clock cycles according to a comparison clock again.

As a result of the determination, if the number of clock cycles generated during a period of a comparison clock is not identical to a threshold value (S930-N), the electronic device 100 determines whether the number of clock cycles generated during a period of a comparison clock is less than a threshold value as a result of counting (S950).

Accordingly, if the number of clock cycles generated during a period of a comparison clock is less than a threshold value as a result of counting (S950-Y), the electronic device 100 controls the clock frequency to increase (S960). If the number of clock cycles generated during a period of a comparison clock is more than a threshold value as a result of counting (S950-N), the electronic device 100 controls the clock frequency to decrease (S970).

The electronic device 100 may control a voltage supplied to a clock generator according to a result of counting, and control a generation period of a clock.

According to an exemplary embodiment, if the number of clock cycles generated during a period of a comparison clock is less than a threshold value as a result of counting, the electronic device 100 may control a voltage input to a clock generator to be increased so that a frequency of a clock to increase. If the number of clock cycles generated during a period of a comparison clock is more than a threshold value as a result of counting, the electronic device 100 may control a voltage input to the clock generator to be decreased so that a frequency of the clock becomes decreases.

The electronic device 100 may control the pulse width of a PWM signal according to a result of counting, and control a generation period of a clock.

According to an exemplary embodiment, if the number of counted clock cycles generated during period T of a comparison clock is less than a threshold value, the electronic device 100 may control the pulse width of a PWM to increase. Also, if the number of counted clock cycles generated during period T of a comparison clock is more than a threshold value, the electronic device 100 may control the pulse width of a PWM signal to decrease.

The electronic device 100 may control a voltage of a clock generator according to an output of the counter 120, and control a generation period of a clock. Meanwhile, the electronic device 100 may easily control a voltage of a clock generator by controlling the pulse width of a PWM signal.

According to an exemplary embodiment, if the pulse width of a PWM signal becomes wider, a voltage input to a clock generator is increased. Accordingly, a frequency of a clock increases. However, if the pulse width of a PWM signal becomes narrower, a voltage input to the clock generator is decreased. Accordingly, a frequency of the clock decreases. Thus, the electronic device 100 may control a generation period of a clock by controlling the pulse width of a PWM signal according to a result of comparison.

According to a method described above, an electronic device is capable of synchronizing a clock signal with another electronic device without using a separate wired connection for clock signal synchronization or a separate synchronization device.

A method for controlling a clock of an electronic device according to various exemplary embodiments may be coded as software and be stored in a non-transitory readable medium. This non-transitory readable medium may be equipped with various apparatuses.

The non-transitory readable medium means a medium which stores a data semi-permanently and is readable by an apparatus. Specifically, a CD, a DVD, a hard disk, a Blu-ray disk, a USB, a memory card and ROM may be the non-transitory readable medium.

Exemplary embodiments have been illustrated and explained above, but the present disclosure is not limited to the described exemplary embodiments. Also, the description of exemplary embodiments is intended to be illustrative, and not to limit the scope of the claims, and it would be appreciated by those skilled in the art that changes may be made to the exemplary embodiments without departing from the principles and spirit of the disclosure, the scope of which is defined in the appended claims.

What is claimed is:

1. A method for controlling a clock of an electronic device, comprising:
   generating a clock signal of the electronic device;
   generating a comparison clock signal having a frequency corresponding to a frequency of an alternating current (AC) power source by monitoring a light fluctuation frequency;
   counting a number of clock cycles of the clock signal in a period of the comparison clock signal; and
   controlling a frequency of the clock signal based on the counted number of clock cycles.

2. The method as claimed in claim 1, wherein the controlling comprises, in response to the number of the clock cycles counted during the period of the comparison clock signal being less than a threshold value, increasing the frequency of the clock signal, and in response to the number of clock cycles counted during the period of the comparison clock signal being more than the threshold value, decreasing the frequency of the clock signal.

3. The method as claimed in claim 2, wherein the controlling comprises controlling a voltage input to a clock generator for generating the clock signal.

4. The method as claimed in claim 1, wherein the controlling comprises, in response to a number of cycles counted during the period of the comparison clock signal being less than a threshold value, increasing the frequency of the clock signal by increasing a voltage input to a clock generator, and in response to the number of clock cycles counted during the period of the comparison clock signal being more than the threshold value, decreasing the frequency of the clock signal by decreasing the voltage input to the clock generator.

5. The method as claimed in claim 1, wherein the controlling further comprises generating a PWM signal for generating the clock signal.

6. The method as claimed in claim 5, wherein the generating the PWM signal comprises, in response to the number of clock cycles counted during the period of the comparison clock signal being less than a threshold value, controlling a pulse width of the PWM signal to become wider, and in response to the number of clock cycles counted during the period of the comparison clock signal being more than the threshold value, controlling the pulse width of the PWM signal to become narrower.

7. The method as claimed in claim 1, further comprising:
   determining a reference time from which the number of clock cycles is counted using a network time protocol (NTP).

8. The method as claimed in claim 1, further comprising:
   receiving an input controlling the generating of the comparison clock signal; and
   controlling the generating the comparison clock signal based on the received input.

9. An electronic device, comprising:
   a photodetector configured to detect a light fluctuation frequency;
   a clock generator configured to generate a comparison clock signal having a frequency corresponding to a frequency of an external AC power source based on the light fluctuation frequency and a clock signal of the electronic device;
   a counter configured to count a number of clock cycles of the clock signal in a period of the comparison clock signal; and
   a clock period controller configured to control a generation period of the clock signal according to the counted number of clock cycles.

10. The electronic device as claimed in claim 9, wherein the clock period controller is configured to, in response to the number of the clock cycles counted during the period of the comparison clock signal being less than a threshold value, control the generation period of the clock signal to become shorter, and in response to the number of the clock cycles counted being more than the threshold value, control the generation period of the clock signal to become longer.

11. The electronic device as claimed in claim 9, wherein the clock period controller is configured to control the generation period of the clock signal by controlling a voltage input to a clock generator configured to generate the clock signal.

12. The electronic device as claimed in claim 9, wherein the clock period controller is configured to, in response to the number of clock cycles generated during the period of the comparison clock signal being less than a threshold value, control a generation period of the clock signal to become shorter by increasing a voltage input to the clock generator, and in response to the number of clock cycles counted during the period of the comparison clock signal being more than the threshold value, control the generation period of the clock signal to become longer by decreasing the voltage input to the clock generator.

13. The electronic device as claimed in claim 9, further comprising:
   a PWM signal controller configured to generate a PWM signal for generating the clock signal.

14. The electronic device as claimed in claim 13, wherein the PWM signal controller is configured to, in response to the number of clock cycles counted during the period of the comparison clock signal being less than a threshold value, control a pulse width of the PWM signal to become wider, and in response to the number of clock cycles counted during the period of the comparison clock signal being more than the threshold value, control the pulse width of the PWM signal to become narrower.

15. The electronic device as claimed in claim 9, further comprising:
   a determiner configured to determine a reference time from which the number of clock cycles is counted using a network time protocol (NTP).

16. The electronic device as claimed in claim 9, wherein the clock generator is further configured to generate the comparison clock signal based on an input provided through a user interface.

17. An electronic device comprising:
   a clock signal generator comprising:
      a clock generator configured to generate a clock signal; and
      a comparison clock generator configured to generate a comparison clock signal;
   a photodetector configured to detect light; and
   a controller configured to identify a periodic fluctuation in the detected light and control the clock signal generator to synchronize the comparison clock signal with the periodic fluctuation and based on the comparison clock signal, synchronize the clock signal with an external clock signal of an external device.

18. The electronic device of claim 17, wherein the controller is configured to control the clock generator to generate the clock signal at a frequency corresponding to a predetermined number of clock cycles per comparison cycle of the comparison clock signal.

* * * * *